United States Patent [19]
Kishi

[11] Patent Number: 5,294,836
[45] Date of Patent: Mar. 15, 1994

[54] SEMICONDUCTOR DEVICE HAVING A WIRING STRIP OF NOBLE METAL AND PROCESS OF FABRICATING THE SEMICONDUCTOR DEVICE

[75] Inventor: Shuji Kishi, Tokyo, Japan
[73] Assignee: NEC Corporation, Tokyo, Japan
[21] Appl. No.: 982,607
[22] Filed: Nov. 27, 1992

[30] Foreign Application Priority Data
Nov. 30, 1991 [JP] Japan .................. 3-342346

[51] Int. Cl.$^5$ ............ H01L 23/48; H01L 29/46; H01L 29/54; H01L 29/62
[52] U.S. Cl. .................. 257/750; 257/763; 257/758; 257/751; 257/770; 257/774
[58] Field of Search ............ 257/750, 758, 763, 774, 257/751, 757, 759, 768, 769, 770, 734, 781

[56] References Cited
U.S. PATENT DOCUMENTS

| | | | |
|---|---|---|---|
| 3,304,362 | 2/1967 | August | 174/50.56 |
| 3,483,610 | 12/1969 | Campo | 29/497 |
| 4,121,241 | 10/1978 | Drake et al. | 357/71 |
| 4,835,593 | 5/1989 | Arnold et al. | 357/71 |
| 4,872,050 | 10/1989 | Okamoto et al. | 357/71 |
| 4,970,574 | 11/1990 | Tsunenari | 357/71 |
| 5,025,303 | 6/1991 | Brighton | 357/68 |

*Primary Examiner*—Andrew J. James
*Assistant Examiner*—Teresa M. Arroyo
*Attorney, Agent, or Firm*—Sughrue, Mion, Zinn, Macpeak & Seas

[57] ABSTRACT

A multi-level wiring structure interconnects circuit components of an integrated circuit fabricated on a semiconductor substrate, and comprises a lower wiring of noble metal covered with an inter-level insulating film, an upper wiring of noble metal extending over the inter-level insulating film, and an inter-level wiring implemented by a tube-shaped metal film filled with a piece of noble metal and passing through the inter-level insulating film for interconnecting the lower and upper wirings so that an electric signal is propagated at high speed without sacrifice of resistivity against migration phenomena.

8 Claims, 5 Drawing Sheets

SEMICONDUCTOR DEVICE HAVING A WIRING STRIP OF NOBLE METAL AND PROCESS OF FABRICATING THE SEMICONDUCTOR DEVICE

FIELD OF THE INVENTION

This invention relates to a semiconductor device and, more particularly, to a multi-level wiring structure incorporated in the semiconductor device.

DESCRIPTION OF THE RELATED ART

A semiconductor manufacturer has been continuously requested to increase the integration density as well as the operation speed of a semiconductor integrated circuit device, and makes development effort on improvement of the multi-level wiring structure fabricated on the semiconductor integrated circuit device for a faster and high integration density device. The operation speed largely relates to the switching speed of the component transistors and time delay introduced by the wiring network associated with the component transistors. Various approaches have been proposed for improving the switching speed of a transistor, and the component transistors achieve fairly high speed switching actions.

On the other hand, the time delay is dominated by the tim constant calculated from the resistance of the wiring strip and parasitic capacitance coupled with the wiring strip, and the time constants of the wiring strips have influences on the characteristics of the semiconductor integrated circuit device. The wiring network in the integrated circuit device is further expected to be highly reliable, because rejected products due to defective wiring strips reach more than 90 percent. Most of the defective wiring strips relate to undesirable disconnection, and electromigration and stress-migration are causative of the disconnections. Some substances for the wiring strips, large amount of current, large stress due to thick inter-level insulating films and high ambient temperature promote the electromigration and the stress-migration. However, large amount of current decreases the time delay, and thick inter-level insulating films are desirable for reduction in parasitic capacitance. Moreover, highly conductive substance and insulator with low dielectric constant decrease the parasitic capacitance, and are desirable for high speed signal propagation. However, the highly conductive substance and the insulator with low dielectric constant are not always resistive against the migration phenomena. Thus, there are a lot of trade-offs between high speed signal propagation and high reliability, and these trade-offs make design work complex.

A trade-off is, by way of example, described hereinbelow in detail. The trade-off relates to the thickness of an inter-level insulating film. FIG. 1 shows a typical example of the multi-level wiring structure, and the multi-level wiring structure is fabricated on a silicon substrate 1. The silicon substrate 1 is covered with a lower insulating film 2 of silicon oxide, and lower wiring strips 3a and 3b are patterned thereon. The lower wiring strips 3a and 3b are overlain by an inter-level insulating film 4, and a contact hole 4a is formed in the inter-level insulating film 4 in such a manner as to be expose the lower wiring strip 3b. An upper wiring strip 5 extends on the inter-level insulating film 4, and is held in contact with the lower wiring strip 3b through the contact hole 4a. The lower and upper wiring strips 3a, 3b and 5 are formed of aluminum-copper alloy, and aluminum-silicon-copper alloy is also available for the wiring strips 3a, 3b and 5. The wiring strips 3a, 3b and 5 are usually formed through a sputtering stage followed by a lithographic stage. Namely, a target of aluminum-copper alloy is opposed to an intermediate structure of the semiconductor device, and the intermediate structure is exposed to flux of the aluminum-copper alloy. An aluminum-copper alloy film is formed on the lower insulating film 2, and a mask layer is patterned on the aluminum-copper alloy film. Using the mask layer, the aluminum-copper alloy film is anisotropically etched by using a reactive ion etching technique, and the lower wiring strips 3a and 3b are patterned on the lower insulating film 2. After deposition of the inter-level insulating film 4, the contact hole is formed through a lithographic process, and the sputtering and the lithographic process are repeated for the upper wiring strip 5. The thicker the inter-level insulating film 4, the smaller the parasitic capacitance coupled with the upper wiring strip 5. Therefore, signal propagation along the upper wiring strip 5 is accelerated by decreasing the thickness of the inter-level insulating film 4. However, the thick inter-level insulating film 4 is causative of poor step-coverage as encircled by dot-and-dash line A. Assuming now that the contact hole 4a is 1 micron in diameter, the inter-level insulating film 4 not less than 0.5 micron deteriorates the step-coverage. For example, the inter-level insulating film 4 as thick as 1 micron causes the upper wiring strip 5 in the contact hole 4a to be several percent of the typical thickness, and the extremely thin portion is much liable to be disconnected due to the electromigration. The aluminum-copper alloy is resistive against the electromigration rather than aluminum. However, the aluminum-copper alloy is less resistive against the stress-migration rather than the aluminum.

In order to enhance the resistivity against the migration phenomena, each of the lower wiring strips 3a and 3b and the upper wiring strip 5 is sandwiched between titanium-tungsten films 6a and 6b, and the contact hole 4a is filled with tungsten 7 as shown in FIG. 2. However, the titanium-tungsten films 6a and 6b increases the thickness of the inter-level insulating film 4, and the step coverage tends to be poor. Moreover, resistance is increased between the tungsten block 7 and the titanium-tungsten films 6a and 6b, and the large resistance prevents the signal on the upper and lower wiring strips 5 and 3b from rapid propagation.

SUMMARY OF THE INVENTION

It is therefore an important object of the present invention to provide a semiconductor device which propagates signals at high speed without sacrifice of resistivity against migration phenomena.

It is also another important object of the present invention to provide a process of fabricating the semiconductor device.

To accomplish the object, the present invention proposes to use noble metal such as, for example, gold or silver which serves tens times longer than aluminum or aluminum alloy against the electromigration and hundreds times longer against the stress-migration, and decreases the resistance at tens percent.

In accordance with one aspect of the present invention, there is provided a semiconductor device fabricated on a semiconductor substrate, comprising: a multi-level wiring structure formed over the semiconductor substrate, and having at least one lower wiring of noble metal covered with an inter-level insulating film, an upper wiring of noble metal extending over the inter-level insulating film, and an inter-level wiring having a conductive block of noble metal and provided in a contact hole formed in the inter-level insulating film for interconnecting the lower and upper wirings.

An integrated circuit may be incorporated in the semiconductor device.

In accordance with another aspect of the present invention, there is provided a process of fabricating a semiconductor device, comprising the steps of: a) preparing a semiconductor substrate covered with a lower insulating film; b) forming a lower wiring on the lower insulating film and having a first conductive film of first noble metal; c) covering the lower wiring with an inter-level insulating film; d) forming a contact hole in the inter-level insulating film, the contact hole exposing the first conductive film; e) depositing a thin film on the entire surface including a side wall defining the contact hole, the thin film being formed of predetermined metal, the first noble metal being diffusible into the predetermined metal; f) allowing the first noble metal of the first conductive film to precipitate at an inner surface of the thin film in the contact hole; g) growing the first noble metal on the inner surface by using the precipitated noble metal as seeds for filling the contact hole with the first noble metal; and h) forming an upper wiring on the inter-level insulating film in such a manner as to be held in contact with the first noble metal in the contact hole, and having a second conductive film of second noble metal.

BRIEF DESCRIPTION OF THE DRAWINGS

The features and advantages of the semiconductor device and the process of fabrication according to the present invention will be more clearly understood from the following description taken in conjunction with the accompanying drawings in which.

DESCRIPTION OF THE PREFERRED EMBODIMENTS

First Embodiment

Figure 1:
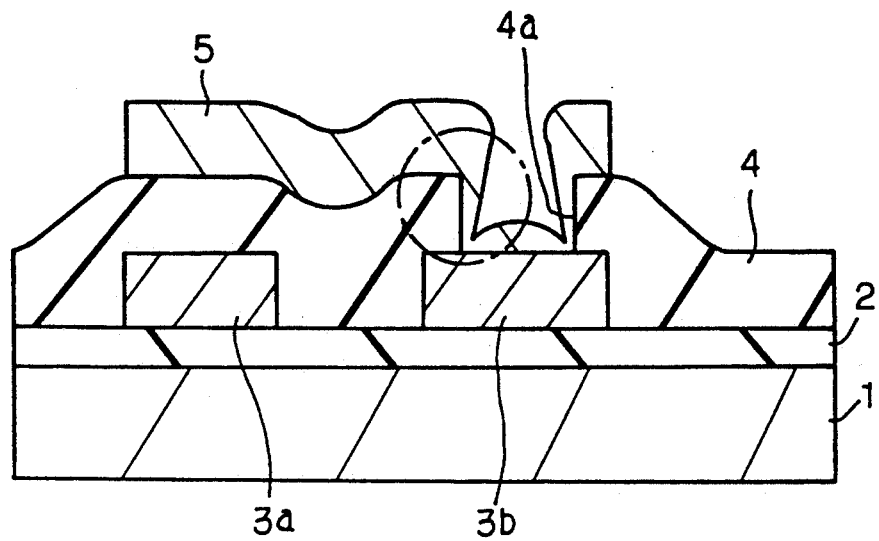
FIG. 1 is a cross sectional view showing the structure of the prior art multi-level wiring structure incorporated in the semiconductor device.
Figure 2:
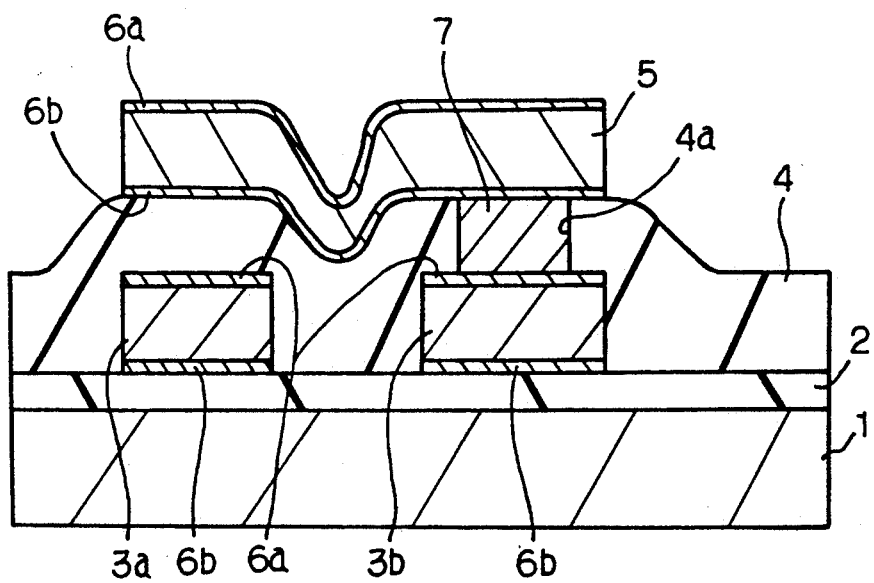
FIG. 2 is a cross sectional view showing the structure of the prior art multi-level wiring structure proposed for improving the problem inherent in the multi-level wiring structure shown in FIG. 1.
Figure 3:
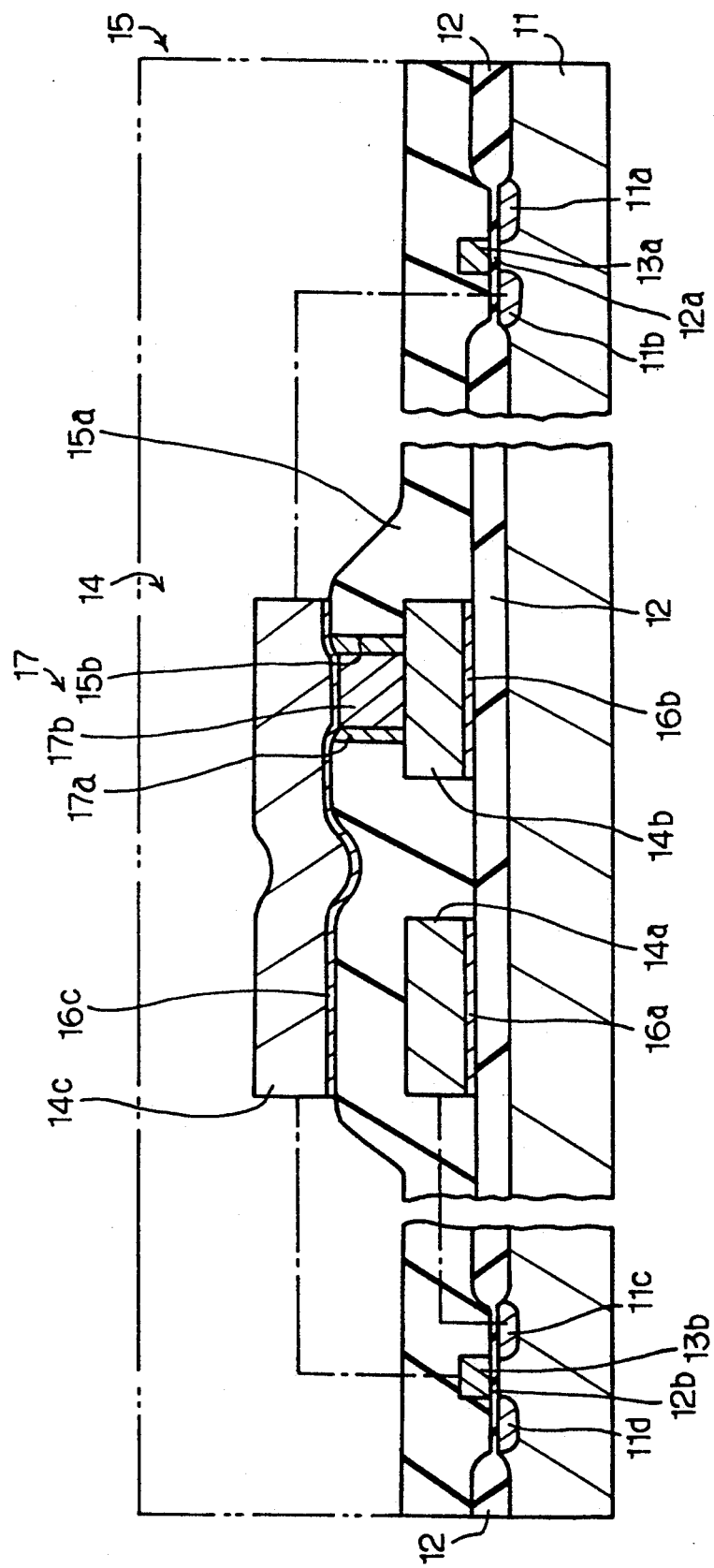
FIG. 3 is a cross sectional view showing the structure of a semiconductor integrated circuit device according to the present invention.

Referring to FIG. 3 of the drawings, a semiconductor integrated circuit device embodying the present invention is fabricated on a p-type silicon substrate 11, and a thick field oxide film 12 is selectively grown on the major surface of the p-type silicon substrate 11. The thick field oxide film 12 defines active areas in the major surface, and n-type source/drain regions 11a, 11b, 11c and 11d are formed in the active areas. The active areas are covered with thin gate oxide films 12a and 12b, and gate electrodes 13a and 13b are provided on the thin gate oxide films 12a and 12b, respectively. The source/drain regions 11a and 11b, the thin gate oxide film 12a and the gate electrode 13a form in combination a component field effect transistor, and the source/drain regions 11c and 11d, the thin gate oxide film 12b and the gate electrode 13b also form another component field effect transistor. The component field effect transistors are electrically coupled through a wiring network 14, and form parts of an integrated circuit together with the wiring network 14. The wiring network 14 has a multi-level structure, and is covered with an inter-level insulating film structure 15. The inter-level insulating film structure 15 has an inter-level insulating film 15a.

The wiring network 14 comprises lower wirings 14a and 14b extending over the thick field oxide film 12, and the lower wirings 14a and 14b are covered with the inter-level insulating film 15a. In order to enhance the adhesion between the thick field oxide film 12 and the lower wirings 14a and 14b, pad films 16a and 16b of, for example, titanium nitride (TiN) are inserted therebetween. However, the pad films 16a and 16b may be formed of tungsten or titanium tungsten.

A contact hole 15b is formed in the inter-level insulating film 15a, and is located over the lower wiring 14b. A tube-shaped titanium film 17a is formed on the vertical wall defining the contact hole 15b, and the hollow space is filled with gold 17b. The tube-shaped titanium film 17a and the gold block 17b as a whole constitute an inter-level wiring 17. The wiring network 14 further comprises an upper wiring 14c, and a pad film 16c of titanium nitride is also inserted between the inter-level insulating film 15a and the upper wiring 14c. The pad film 16c is held in contact with the gold block 17b, and the lower wiring 14b is electrically coupled through the gold block 17b with the upper wiring 14c. In this instance, the lower and upper wirings 14a, 14b and 14c are formed of gold. However, the lower and upper wirings 14a, 14b and 14c may be formed of silver, and the gold block 17 is replaceable with a silver block.

Description is hereinbelow made on a process for fabricating the semiconductor integrated circuit device according to the present invention. Although a sequence for fabricating the circuit components is mixed with a sequence for fabricating the multi-level wiring structure, only the sequence for the multi-level wiring structure is described with reference to FIGS. 4A to 4F, because the sequence for the circuit components does not directly relate to the gist of the present invention.

The process sequence starts with preparation of the p-type silicon substrate 11 selectively covered with the thick field oxide film 12. A titanium nitride film 21 is deposited on the entire surface of the structure to thickness of 300 angstroms through a sputtering, and a gold film 22 is, then, deposited on the titanium nitride film 21 to thickness of 100 angstroms also through a sputtering. Photo-resist solution is spun onto the entire surface for forming a photo-resist film, and a photo-resist mask 23 is patterned on the gold film 22 by using lithographic techniques. The photo-resist mask 23 partially exposes the gold film 22, and gold films 24 is grown to 1 micron on the exposed gold film 22 by using an electroless plating technique. The electroless plating is carried out for 2.5 hours in an appropriate plating solution such as, for example, Super Mex No. 700 (trademark) manufactured by N. E. Chemcat Corporation, and the Super Mex No. 700 is regulated at 70 degrees in centigrade at ph=7.0.

Figure 4A:
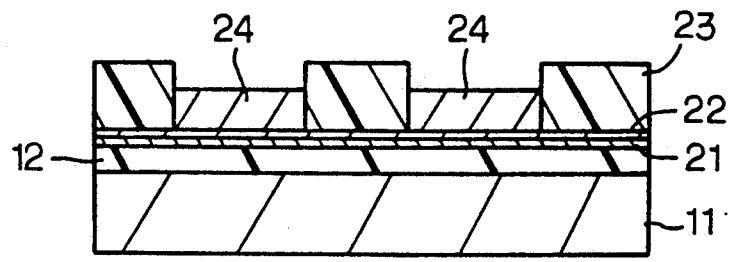
FIGS. 4A to 4F are cross sectional views showing a process sequence for fabricating a multi-level wiring structure incorporated in the semiconductor integrated circuit device.

In case of the electroless plating, it is possible to decreases the titanium nitride film 21 and the gold film 22 from the above described thicknesses. However, if the gold films 24 are grown through an electroplating technique, it is advisable to increase the thickness of the gold film 22 more than 300 angstroms, because irregularity tends to take place in the thickness of the gold films 24 due to the large resistance against current. One of the electrolyte available for the electroplating is Electroplating Solution coded as ECF 66A manufactured by N. E. Chemcat Corporation. While the gold films 24 are growing, the ECF electroplating Solution is regulated at 65 degrees in centigrade at pH=7.0, and current density is 0.4 ampere/$dm^2$. If the electroplating is carried out under these conditions for 5 minutes, the gold films 24 reach about 1.0 micron. The resultant structure of this stage is illustrated in FIG. 4A.

The photo-resist mask 23 is, then, stripped off, and the gold films 22 and 24 and the titanium nitride film 21 are subjected to an ion milling. Then, the gold films 24 and the titanium nitride film 21 overlain by the gold film 22 are uniformly removed, and the titanium nitride film 21 is left only beneath the gold films 24. The gold films 24> serves as the lower wirings 14a and 14b, and the titanium nitride film 21 thus left beneath the gold films 24 serves as the pad films 16a and 16b.

Figure 4B:
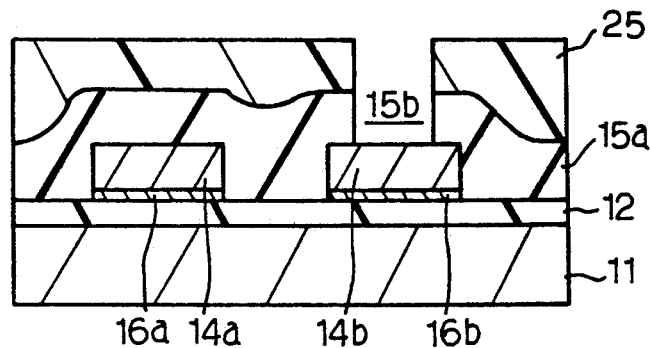

Subsequently, a silicon dioxide film is deposited over the entire surface of the structure by using a plasma-assisted chemical vapor phase deposition technique followed by a spin-on-glass technique, and such a composite structure is desirable for reflow. The silicon dioxide film thus formed serves as the inter-level insulating film 15a. Photo-resist solution is spun onto the entire surface for forming a photo-resist film, and the photo-resist film is patterned through lithographic techniques into a photo-resist mask 25. The photo-resist mask 25 exposes the inter-level insulating film 15a over the lower wiring 14b. A reactive ion etching is applied to formation of the contact hole 15b, and the inter-level insulating film 15a is anisotropically etched under the ion bombardment. In order to produce the vertical smooth inner surface, etching conditions are regulated in such a manner that the etching rate to the silicon dioxide produced through the chemical vapor phase deposition is approximately equal to the etching rate to the silicon dioxide produced through the spin-on glass technique. FIG. 4B illustrates the resultant structure immediately after the formation of the contact hole 15b.

Figure 4C:
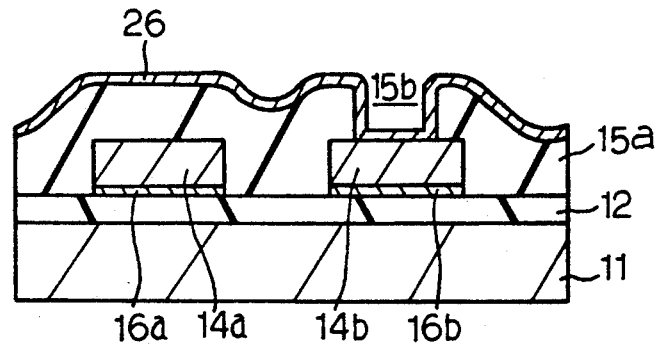

The photo-resist mask 25 is, then, striped off, and a titanium film 26 is sputtered to 100 to 200 angstroms on the entire surface of the structure as shown in FIG. 4C. The titanium film 26 thus deposited is placed in high temperature nitrogen at 400 to 500 degrees in centigrade, then gold atoms and titanium atoms are mutually diffused from the interface therebetween. The gold atoms reach the inner surface of the titanium film 26, and are exposed to the contact hole 15b. As a result, the titanium film 26 defining the bottom surface of the contact hole 15b is merged into the lower wiring 14b. Either furnace or lamp annealing is available for the heat treatment. However, it is important to decrease the partial pressure of oxygen to approximately zero, because oxidized titanium prevents the gold atoms and titanium atoms from the mutual diffusion. Moreover, it is desirable to minimize the thickness of the titanium film 26. If not, difficult conditions are required for the mutual diffusion, and the resistance of the inter-level wiring 17 is increased.

Figure 4D:
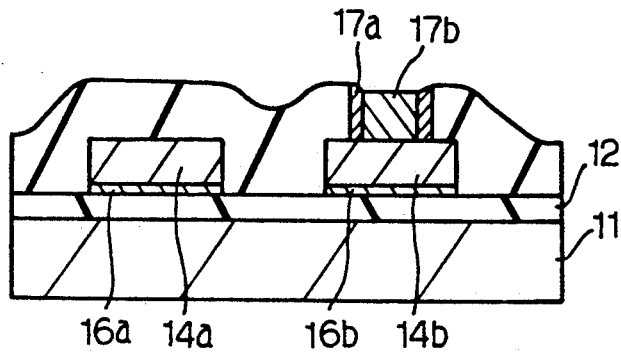

Subsequently, the electroless plating is carried out by using the gold atoms as seeds, and gold is grown in the contact hole 15b. In the electroless plating technique, gold precipitates on the gold atoms, and, for this reason, any stripe hardly takes place in the gold block 17b. After the growth of gold, a reactive ion etching removes the titanium film 26 on the inter-level insulating film 15a, and the tube-shaped titanium film 17a filled with the gold block 17b is left in the contact hole 15b. The resultant structure of this stage is illustrated in FIG. 4D. In general, if potential difference takes place on a substrate for the electroless plating, the growing speed tends not to be uniform. However, the titanium film 26 decreases the potential difference, and the gold is uniformly grown in the contact hole 15b. In fact, the electroless plating on the titanium film 26 results in irregularity of thickness not greater than 10 percent.

Figure 4E:
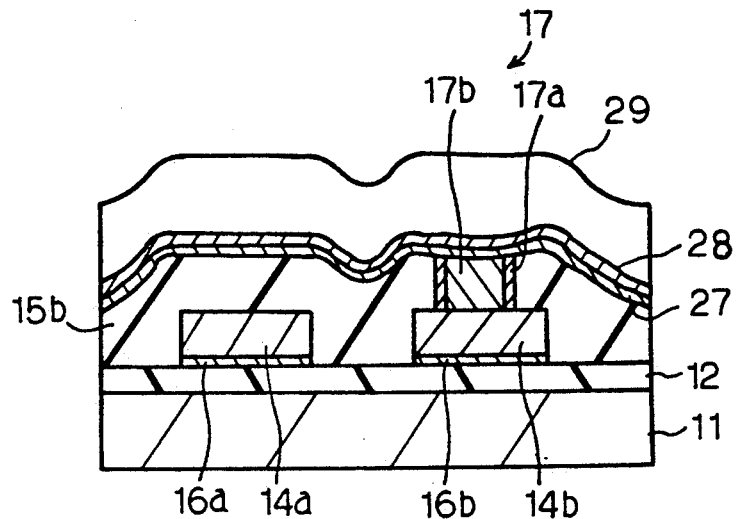
Figure 4F:
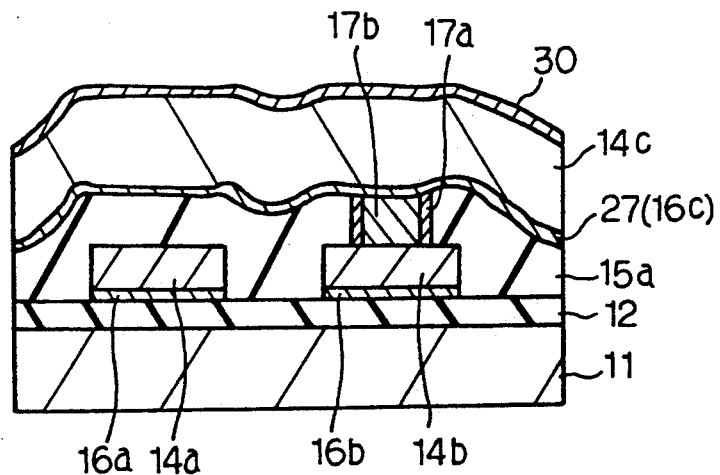

After the growth of the gold block 17b, a titanium nitride film 27 and a gold film 28 are sequentially deposited over the entire surface of the structure, and photo-resist solution is spun onto the gold film 28 for forming a photo-resist film. The photo-resist film is patterned into a photo-resist mask 29 through the lithographic techniques, and the photo-resist mask 29 exposes the gold film 28 where the upper wiring 14c is grown. The resultant structure of this stage is illustrated in FIG. 4E.

Using the photo-resist mask 29 as a plating resist mask, gold is grown by using the electroless plating technique, and a gold film 28 is partially increased in thickness. After the growth of gold, the photo-resist mask 29 is stripped off, and the ion milling is applied to the gold film 28 and the titanium nitride film 27 as similar to the lower wirings 14a and 14b, thereby patterning the upper wiring 14c. A titanium nitride film 30 may be deposited on the upper wiring 14c for the next wiring level.

As described hereinbefore, silver is available for the lower and upper wirings 14a to 14c, and suitable solution is used for upper and lower silver wirings in an electroless plating. The silver is attractive in view of conductivity in comparison with gold. In case of the silver wirings, the gold film 22 is replaced with a silver film deposited by a sputtering.

As will be appreciated from the foregoing description, the lower and upper wirings 14a to 14c as well as the inter-level wiring 17 are formed of gold, and the gold is highly resistive against the migration phenomena. Moreover, the gold is much lower in resistivity against current than aluminum and aluminum alloy. For this reason, the multi-level wiring structure according to the present invention propagates electric signals at high speed without sacrifice of resistance against the migration phenomena.

Second Embodiment

Figure 5A:
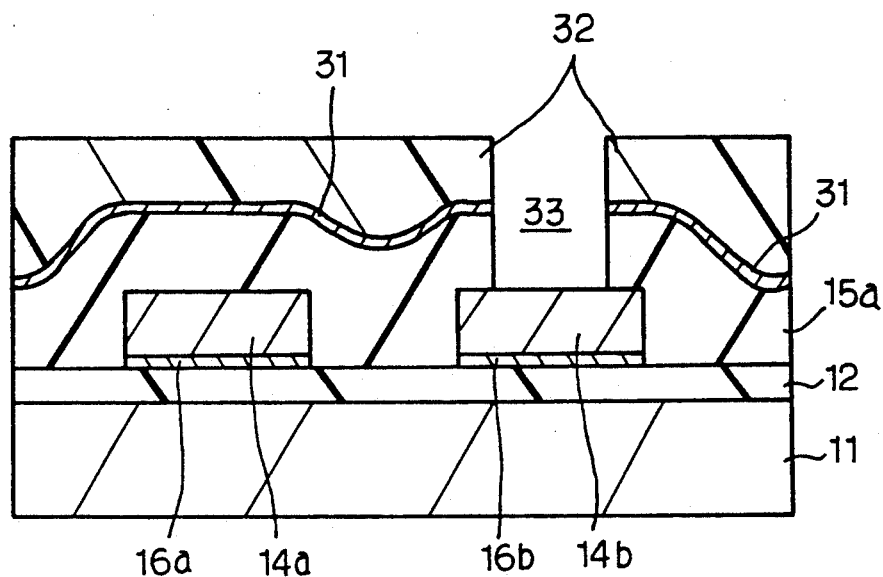
FIGS. 5A and 5 are cross sectional views showing essential stages of another process sequence according to the present invention.
Figure 5B:
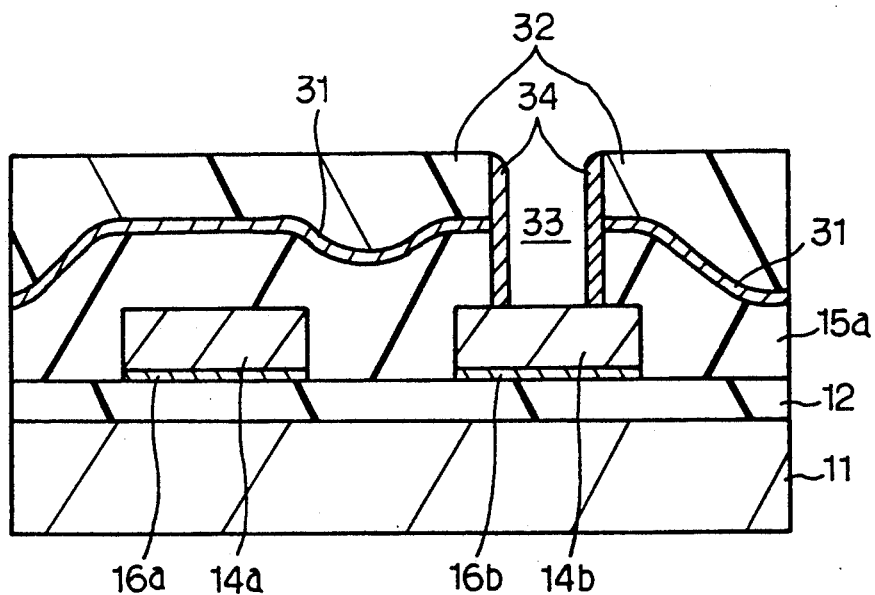

Turning to FIGS. 5A and 5B, essential stages of another process sequence are illustrated, and relate to uniform growth of the gold block 17b. However, the other steps are similar to those of the first embodiment, and corresponding films and strips are labeled with the same references as those of the first embodiment without any detailed description for avoiding repetition.

After the lower wirings 14a and 14b are covered with the inter-level insulating film 15a, a titanium film 31 is deposited over the entire surface of the structure to thickness ranging between 500 angstroms and 1000 angstroms. Photo-resist solution is spun onto the titanium film 31, and the photo-resist film is patterned into a photo-resist mask 32 through the lithographic techniques. Using the photo-resist mask 32, the titanium film 31 and the inter-level insulating film 15a are partially etched away through reactive ion etching techniques, and a contact hole 33 reaches the lower wiring 14b as shown in FIG. 5A.

A titanium film 34 is sputtered on the entire surface of the structure to thickness ranging between 500 angstroms and 1000 angstroms, and the titanium film 34 is uniformly etched until the upper surface of the photo-resist mask 32 is exposed. Then, the titanium film 34 is left on the inner surface defining the contact hole 33 only, and is electrically connected with the titanium film 31 as shown in FIG. 5B. Thus, the tube-shaped titanium film 34 is left on the inner surface only, and the lower wiring 14b is exposed to the contact hole 33. For this reason, even if the titanium film 34 is much thicker than the titanium film 26, no problem is encountered in the mutual diffusion, and potential difference on the lower wiring is improved rather than the first embodiment. The maximum thickness of the titanium film 34 is restricted by the dimensions of the contact hole 33. If the contact hole 33 is 0.8 micron in diameter and 1 micron in depth, the titanium film 34 of 1000 angstroms thick is preferable.

Subsequently, gold is grown through the electroless plating, and the contact hole 33 is filled with gold until the top surface of the gold column becomes substantially coplanar with the photo-resist mask 32. Then, the photo-resist mask 32 is stripped off, and the tube-shaped titanium film 34 over the inter-level insulating film 15a and the titanium film 31 are etched away by using reactive ion etching techniques, and the resultant structure corresponds to that shown in FIG. 4D. Though not shown in the drawings, a pad film 16c and an upper wiring are formed on the inter-level insulating film 15a as similar to those of the first embodiment.

Although particular embodiments of the present invention have been shown and described, it will be obvious to those skilled in the art that various changes and modifications may be made without departing from the spirit and scope of the present invention. For example, the wiring network may have more than two level structure. Moreover, tungsten and titanium-tungsten alloy are available instead of the titanium, because these metals allow the manufacturer to carry out selective plating.

I claim:

1. A semiconductor device fabricated on a semiconductor substrate, comprising: a multi-level wiring structure formed over said semiconductor substrate, having at least one lower wiring comprised of gold covered with an inter-level insulating film, an upper wiring comprised of nobel metal extending over said inter-level insulating film, and an inter-level wiring having a conductive metal tube formed on an inner surface of a contact hole of said inter-level insulating film and formed of a substance selected from the group consisting of titanium and titanium tungsten alloy and a conductive block of gold and provided in said conductive metal tube for interconnecting said lower and upper wiring, said at least one lower wiring having a titanium-diffused region held in contact with said conductive block and formed through a mutual diffusion between gold atoms and titanium atoms.

2. A semiconductor device as set forth in claim 1, in which said nobel metal is gold.

3. A semiconductor integrated circuit device fabricated on a semiconductor substrate, comprising:
   a) circuit components forming parts of an integrated circuit; and
   b) a multi-level wiring structure formed over said semiconductor substrate, having at least one lower wiring comprised of gold covered with an inter-level insulating film, an upper wiring of gold extending over said inter-level insulating film, and an inter-level wiring having a conductive metal tube formed on an inner surface of a contact hole of said inter-level insulating film and formed of a substance selected from the group consisting of titanium and titanium tungsten alloy and a conductive block of gold and provided in said conductive metal tube for interconnecting said lower and upper wirings, said at least one lower wiring having a titanium-diffused region held in contact with said conductive block and formed through a mutual diffusion between gold atoms and titanium atoms.

4. A semiconductor device as set forth in claim 1, wherein said conductive metal tube has thickness ranging between 100 angstroms and 200 angstroms, said mutual diffusion being carried out in a high temperature nitrogen atmosphere.

5. A semiconductor device as set forth in claim 1, wherein said conductive block of gold is gown through an electroless plating.

6. A semiconductor device as set forth in claim 3, wherein said conductive metal tube has a thickness ranging between 100 angstroms and 200 angstroms, said mutual diffusion being carried out in high temperature nitrogen atmosphere.

7. A semiconductor device as set forth in claim 4, wherein said conductive block of gold is grown through an electroless plating.

8. A semiconductor device as set forth in claim 6, wherein said conductive block of gold is grown through an electroless plating.

* * * * *

UNITED STATES PATENT AND TRADEMARK OFFICE
CERTIFICATE OF CORRECTION

PATENT NO. : 5,294,836
DATED : March 15, 1994
INVENTOR(S) : Shuji Kishi

It is certified that error appears in the above-identified patent and that said Letters Patent is hereby corrected as shown below:

Col. 5, line 26, delete ">";

Col. 8, line 1, delete "nobel" and insert -- noble--;

Col. 8, line 14, delete "nobel" and insert -- noble--.

Signed and Sealed this

Eleventh Day of October, 1994

Attest:

BRUCE LEHMAN

Attesting Officer     Commissioner of Patents and Trademarks